US007646266B2

(12) United States Patent
Igaki et al.

(10) Patent No.: US 7,646,266 B2
(45) Date of Patent: Jan. 12, 2010

(54) SURFACE ACOUSTIC WAVE RESONATOR AND SURFACE ACOUSTIC WAVE FILTER USING THE SAME

(75) Inventors: Tsutomu Igaki, Hyogo (JP); Shun-ichi Seki, Hyogo (JP); Kazuo Ikeda, Osaka (JP)

(73) Assignee: Panasonic Corporation, Osaka (JP)

( * ) Notice: Subject to any disclaimer, the term of this patent is extended or adjusted under 35 U.S.C. 154(b) by 269 days.

(21) Appl. No.: 11/587,538

(22) PCT Filed: Apr. 21, 2005

(86) PCT No.: PCT/JP2005/007592

§ 371 (c)(1),
(2), (4) Date: Oct. 25, 2006

(87) PCT Pub. No.: WO2005/107069

PCT Pub. Date: Nov. 10, 2005

(65) Prior Publication Data

US 2008/0018417 A1   Jan. 24, 2008

(30) Foreign Application Priority Data

Apr. 28, 2004   (JP) ............................. 2004-133119

(51) Int. Cl.
*H03H 9/25* (2006.01)
*H03H 9/64* (2006.01)

(52) U.S. Cl. ..................... 333/195; 333/193; 310/313 D

(58) Field of Classification Search ................. 333/195, 333/193; 310/313 B, 313 D
See application file for complete search history.

(56) References Cited

U.S. PATENT DOCUMENTS

| 3,970,970 | A | * | 7/1976 | Worley ........................ 333/195 |
| 5,559,481 | A | | 9/1996 | Satoh et al. |
| 5,877,662 | A | * | 3/1999 | Kobayashi et al. .......... 333/195 |
| 6,049,260 | A | | 4/2000 | Yoshimoto et al. |
| 6,420,946 | B1 | | 7/2002 | Bauer et al. |
| 6,909,338 | B2 | * | 6/2005 | Omote ........................ 333/133 |
| 2004/0000842 | A1 | * | 1/2004 | Yata ........................... 310/322 |

FOREIGN PATENT DOCUMENTS

CN   1119372   3/1996

(Continued)

OTHER PUBLICATIONS

Machine translation of JP 2003-332884, published Nov. 21, 2003.*

(Continued)

*Primary Examiner*—Barbara Summons
(74) *Attorney, Agent, or Firm*—Wenderoth, Lind & Ponack, L.L.P.

(57) ABSTRACT

A Q-factor of a resonator at a high frequency is improved. An insertion loss of a filter using such a resonator and steepness of the filter are improved. A plurality of surface acoustic wave resonators including an interdigital transducer and reflecting electrodes provided on both sides thereof are connected in parallel on a piezoelectric substrate. Resonance frequencies of the surface acoustic wave resonators are rendered equal among all the resonators connected in parallel. In this way, the Q-factor of the resonance can be improved. A surface acoustic wave filter using such surface acoustic wave resonators is formed in order to improve the insertion loss and the steepness.

11 Claims, 13 Drawing Sheets

FOREIGN PATENT DOCUMENTS

| | | |
|---|---|---|
| JP | 63-102414 | 5/1988 |
| JP | 3-283710 | 12/1991 |
| JP | 5-183380 | 7/1993 |
| JP | 3137064 | 12/2000 |
| JP | 2001-119260 | 4/2001 |
| JP | 2002-528987 | 9/2002 |
| JP | 2003-332884 | * 11/2003 |
| JP | 2004-320411 | * 11/2004 |

OTHER PUBLICATIONS

Machine translation of JP 2004-320411, published Nov. 11, 2004.*
Chinese Office Action issued Aug. 15, 2008 in Chinese Application No. 2005800130220.

* cited by examiner

US 7,646,266 B2

SURFACE ACOUSTIC WAVE RESONATOR AND SURFACE ACOUSTIC WAVE FILTER USING THE SAME

BACKGROUND OF THE INVENTION

1. Technical Field

The present invention relates to a surface acoustic wave resonator and a surface acoustic wave filter using the same which are used in particular for cellular phones or the like.

2. Background Art

Conventionally, such surface acoustic wave filters have had a structure as shown in FIG. 13.

In a surface acoustic wave filter shown in FIG. 13, a series resonator 2 and a parallel resonator 3 which are surface acoustic wave resonators are formed on a piezoelectric substrate 1 and connected to each other to provide a filter characteristic. As the resonators, multiple pairs of interdigital transducers or an interdigital transducer with reflecting electrodes being provided on both sides have been employed.

As a document on the conventional art related to the present invention, Japanese Laid-Open Publication No. 2001-119260 is known, for example.

The structure described above has a problem that sufficient Q-factors of the resonators cannot be secured when the frequency increases. Furthermore, when a filter is formed, there is a limit on improving insertion loss and steepness.

BRIEF SUMMARY OF THE INVENTION

The present invention is to solve the above-described conventional problems, and objects thereof are to improve Q-factors of surface acoustic wave resonators and provide surface acoustic wave filters with low insertion loss and high steepness.

In order to achieve the above-described objects, in the present invention a plurality of surface acoustic wave resonators including an interdigital transducer (hereinafter, referred to as "IDT") and reflecting electrodes provided on both sides of the IDT are connected in parallel, and resonance frequencies of the surface acoustic wave resonators connected in parallel are made equal among all the surface acoustic wave resonators connected in parallel.

According to the present invention, Q-factors of the surface acoustic wave resonators can be improved. The insertion loss of the surface acoustic wave filter can be reduced, and the steepness of the filter characteristic can be improved.

DETAILED DESCRIPTION OF THE INVENTION

Embodiment 1

Figure 1:
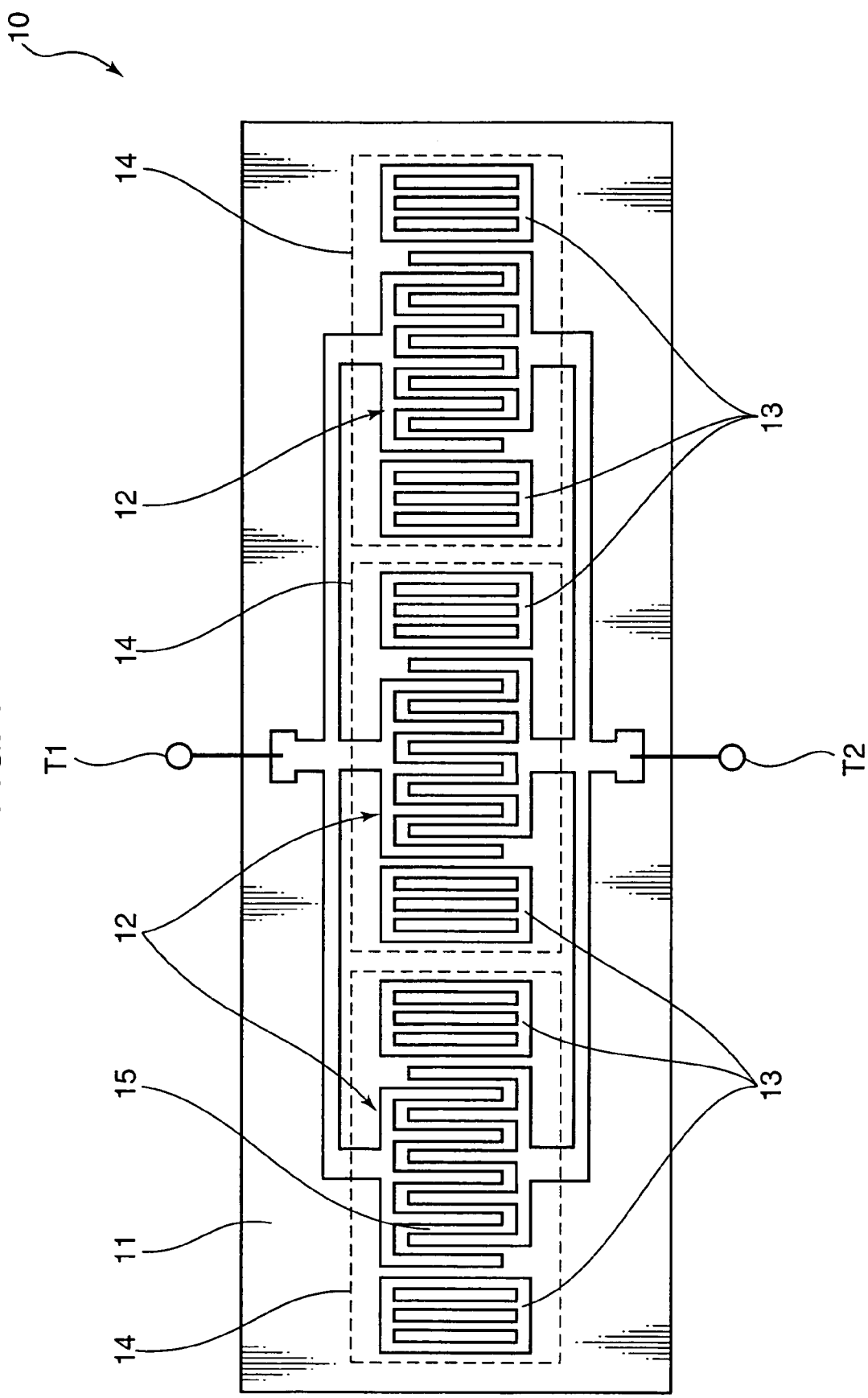
FIG. 1 is a diagram showing a structure of electrodes of surface acoustic wave resonators (Embodiment 1).

Hereinafter, Embodiment 1 of the present invention will be described. FIG. 1 is a diagram showing an exemplary structure of a surface acoustic wave resonator 10 according to Embodiment 1 of the present invention. The surface acoustic wave resonator 10 shown in FIG. 1 is a so-called one-port resonator. The surface acoustic wave resonator 10 includes a signal input terminal T1 for receiving a signal input from the outside, a signal output terminal T2 for outputting a signal to the outside, and a piezoelectric substrate 11 formed of 39° Y-cut, X-propagating lithium tantalate. On a surface of the piezoelectric substrate 11, three surface acoustic wave resonators 14 (surface acoustic wave resonators) are formed in line on the same surface acoustic wave propagation path.

Each of the surface acoustic wave resonators 14 includes an IDT 12 and two reflectors 13 (reflecting electrodes) being adjacent to both ends of the IDT 12. Three surface acoustic wave resonators 14 having the same structures, i.e., surface acoustic wave resonators 14 having substantially the same resonance frequencies are connected in parallel and are connected in series between the signal input terminal T1 and the signal output terminal T2, i.e., a signal path. In this example, the number of the reflectors 13 provided between a plurality of IDTs 12 in the surface acoustic wave resonator 10 is two.

Figure 2:
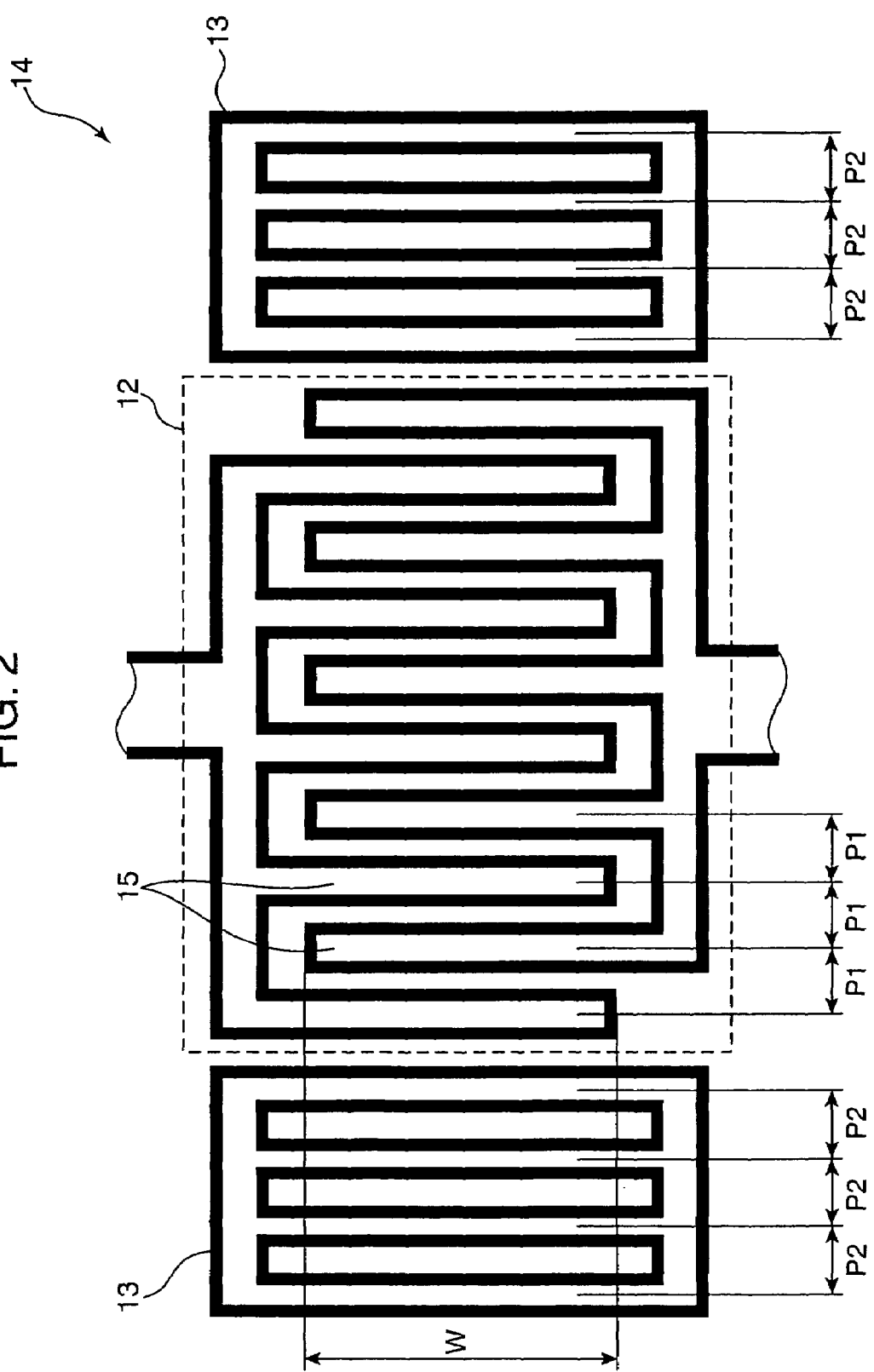
FIG. 2 is an enlarged view of the surface acoustic wave resonators.

FIG. 2 is an enlarged view of one of the surface acoustic wave resonators 14 shown in FIG. 1. In the surface acoustic wave resonator 14, for example, a film thickness of electrodes of the IDT 12 and the reflectors 13 is about 0.4 µm, an overlap length W of the IDT 12 is about 40 µm, the number of electrode fingers 15 in the IDT 12 is 200, the number of electrodes in a reflector 13 is 50, pitch P1 for the electrode fingers 15 in the IDT 12 is about 2.33 µm, and pitch P2 for the electrodes in the reflectors 13 is about 2.38 µm. The surface acoustic wave resonator 14 shown in FIG. 2 is simplified, and is shown as having 10 electrode fingers 15 in the IDT 12 and four electrodes in the reflector 13.

The resonance frequency of the surface acoustic wave resonator 14 is determined based on mainly the film thickness of the electrodes and the pitch P1 for the electrode fingers 15. The three surface acoustic wave resonators 14 shown FIG. 1 all have the same structure, such as the film thickness of the electrodes, the pitch P1 for the electrode fingers 15, and the like. Thus, the resonance frequencies of the surface acoustic wave resonators 14 connected in parallel are all the same.

Figure 3:
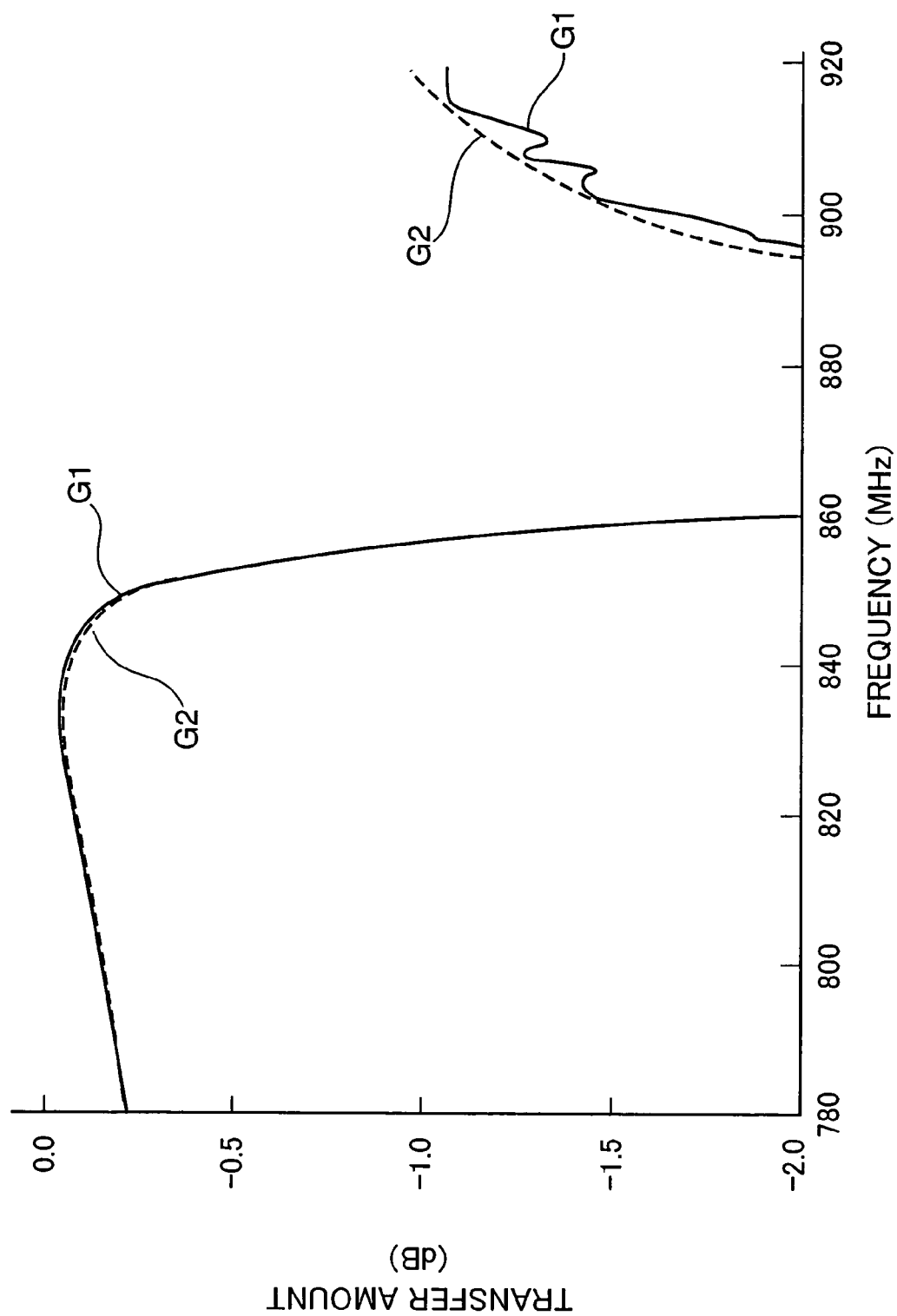
FIG. 3 is a diagram showing a comparison of frequency properties of the surface acoustic wave resonator shown in FIG. 1 and a conventional surface acoustic wave resonator.
Figure 13:
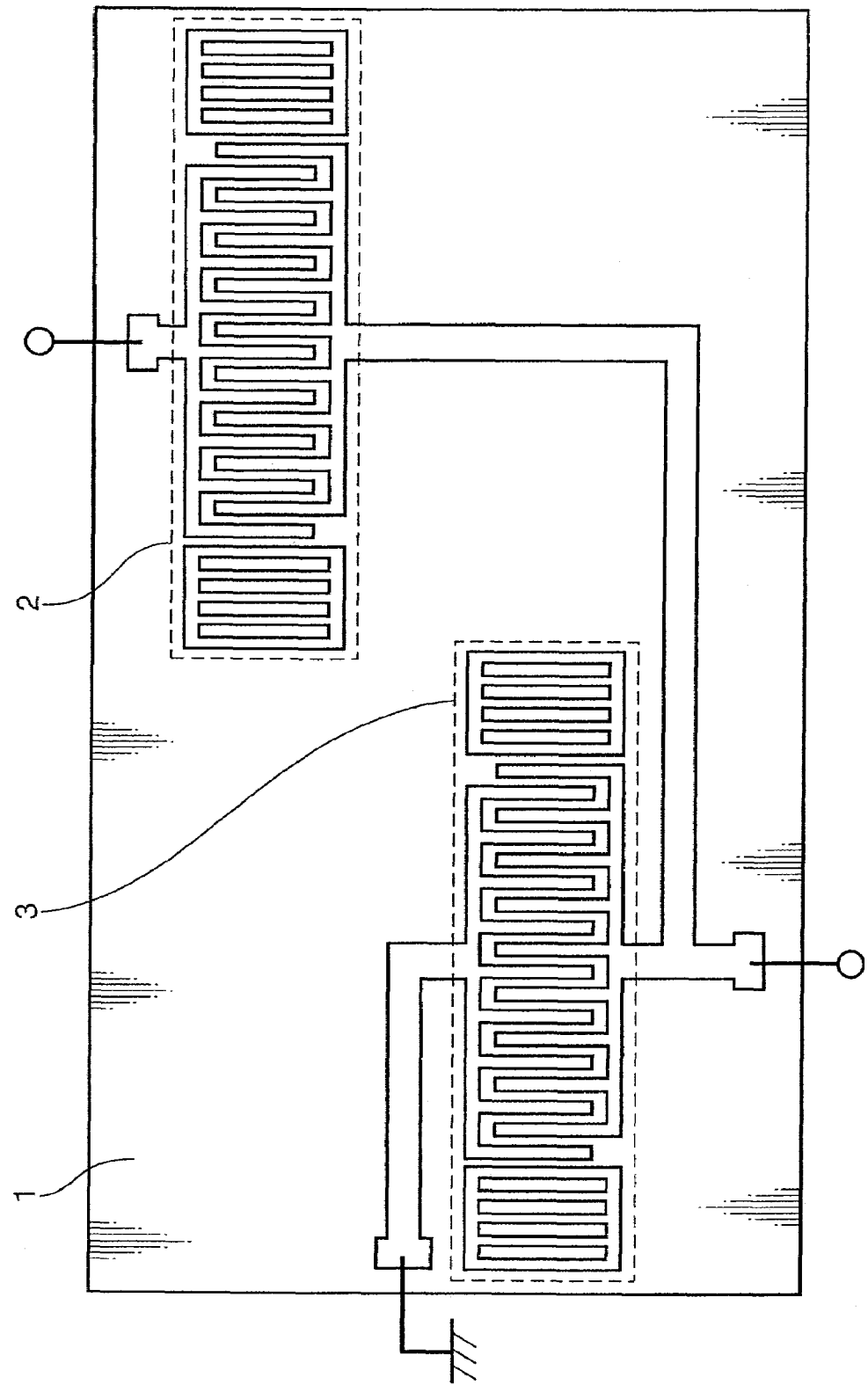
FIG. 13 is a diagram showing a structure of electrodes of a conventional surface acoustic wave resonator.

FIG. 3 shows a frequency property of the surface acoustic wave resonator 10 having the above-described structure and a frequency property of the series resonator 2 in the conventional surface acoustic wave filter shown in FIG. 13, which are obtained by simulation. The frequency property of the surface acoustic wave resonator 10 shown in FIG. 1 is represented by a solid line as graph G1 in FIG. 3. Graph G2 shown by a broken line in FIG. 3 represents the frequency property of the conventional surface acoustic wave resonator shown in FIG. 13 which includes one IDT and reflectors provided on both sides of the IDT. This conventional surface acoustic wave resonator includes one IDT including 600 electrode fingers. This is the same number as the total of the electrode fingers 15 in the three IDTs 12 of the surface acoustic wave resonator 14 shown in FIG. 1. Other conditions are same as those of the surface acoustic wave resonator 10.

By comparing the graph G1 and the graph G2 shown in FIG. 3, it can be seen that the graph G1 is more highly raised from a resonance point to a non-resonance point. Now, the Q-factors of the resonances are compared. In the present invention as represented by the graph G1, the resonance frequency of the surface acoustic wave resonator 10 is about 840 MHz (the resonance frequency of each of the surface acoustic wave resonators 14 is also about 840 MHz), and the Q-factor of the resonance is about 870. Meanwhile, the Q-factor of the conventional surface acoustic resonator represented by the graph G2 is about 830. It can be seen that the Q-factor of the resonance is improved in the surface acoustic wave resonator 10 of the present invention.

In this example, three surface acoustic wave resonators 14 having the same resonance frequency are connected in parallel to form the surface acoustic wave resonator 10. Having the same resonance frequency includes the case where there is a difference in the resonance frequencies of a plurality of the surface acoustic wave resonators 14 connected in parallel due to error factors such as manufacturing variation and the like. For example, when a difference between the maximum resonance frequency and the minimum resonance frequency of the plurality of the surface acoustic wave resonators 14 connected in parallel is 0.03% or lower, the resonance frequencies are substantially the same.

Figure 4:
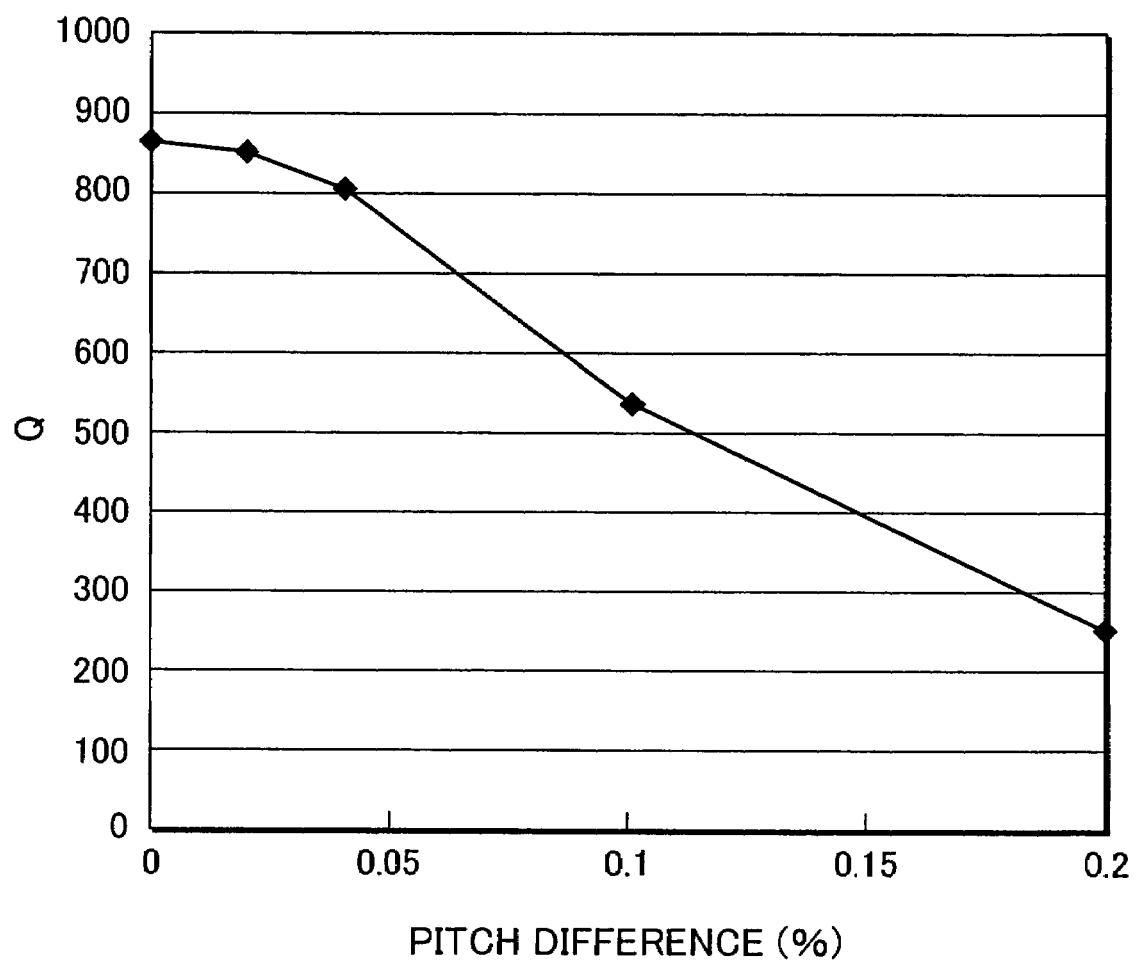
FIG. 4 is a graph showing Q-factor of the surface acoustic wave resonator when there is a difference in pitch for electrode fingers in the three surface acoustic wave resonators included in the surface acoustic wave resonator shown in FIG. 1, which is obtained by simulation.

FIG. 4 is a graph representing the Q-factor of the resonance of the surface acoustic wave resonator 10 when there is a difference in the pitch P1 for the electrode fingers 15 in the three surface acoustic wave resonators 14 of the surface acoustic wave resonator 10 shown in FIG. 1, which is obtained by simulation. In the graph shown in FIG. 4, a pitch difference shown by a horizontal axis is a difference between the maximum pitch and the minimum pitch among the three surface acoustic wave resonators 14 which is represented in percentage. For example, in the surface acoustic wave resonator 10 shown in FIG. 1, if pitch P1 for the electrode fingers 15 in the surface acoustic wave resonator 14 at one end is narrower than pitch P1 for the electrode fingers 15 in the central surface acoustic wave resonator 14 by 0.05% and pitch P1 for the electrode fingers 15 in the surface acoustic wave resonator 14 at the other end is broader than the pitch P1 for the electrode fingers 15 in the central surface acoustic wave resonator 14 by 0.05%, the pitch difference is represented as 0.1%.

In the surface acoustic wave resonators 14 used for the simulation of FIG. 4, the film thickness of the electrodes of the IDTs 12 and the reflectors 13 is 0.4 μm, the overlap length W of the IDTs 12 is 40 μm, the number of the electrode fingers 15 in the IDTs 12 is 200, the number of electrodes of the reflectors 13 is 50, and pitch P2 for the electrodes in the reflectors 13 is 2.38 μm. The pitch P1 for the electrode fingers 15 in the IDT 12 provided in the central surface acoustic wave resonator 14 among the three surface acoustic wave resonators 14 is 2.33 μm.

As shown in FIG. 4, the Q-factor of the surface acoustic wave resonator 10 is 870 when the pitch difference is 0%. The Q-factor is 855 when the pitch difference is 0.02%. The Q-factor is 807 when the pitch difference is 0.04%. The Q-factor is 532 when the pitch difference is 0.1%. The Q-factor is 248 when the pitch difference is 0.2%. Thus, it is confirmed that the Q-factor of the resonance can be improved in the surface acoustic wave resonator 10 compared to that of the conventional surface acoustic wave resonator (series resonator 2) shown in FIG. 13 when the pitch difference among the plurality of surface acoustic wave resonators 14 is 0.03% or lower (corresponding to when the difference in the resonance frequencies is 0.03% or lower).

In this example, three surface acoustic wave resonators 14 having the same structure are connected in parallel to form the surface acoustic wave resonator 10. The present invention is not limited to the example of connecting a plurality of surface acoustic wave resonators 14 having the same structure in parallel. The surface acoustic wave resonator 10 may be formed by connecting a plurality of surface acoustic wave resonators 14 having the same resonance frequency but different structures in parallel.

Figure 5:
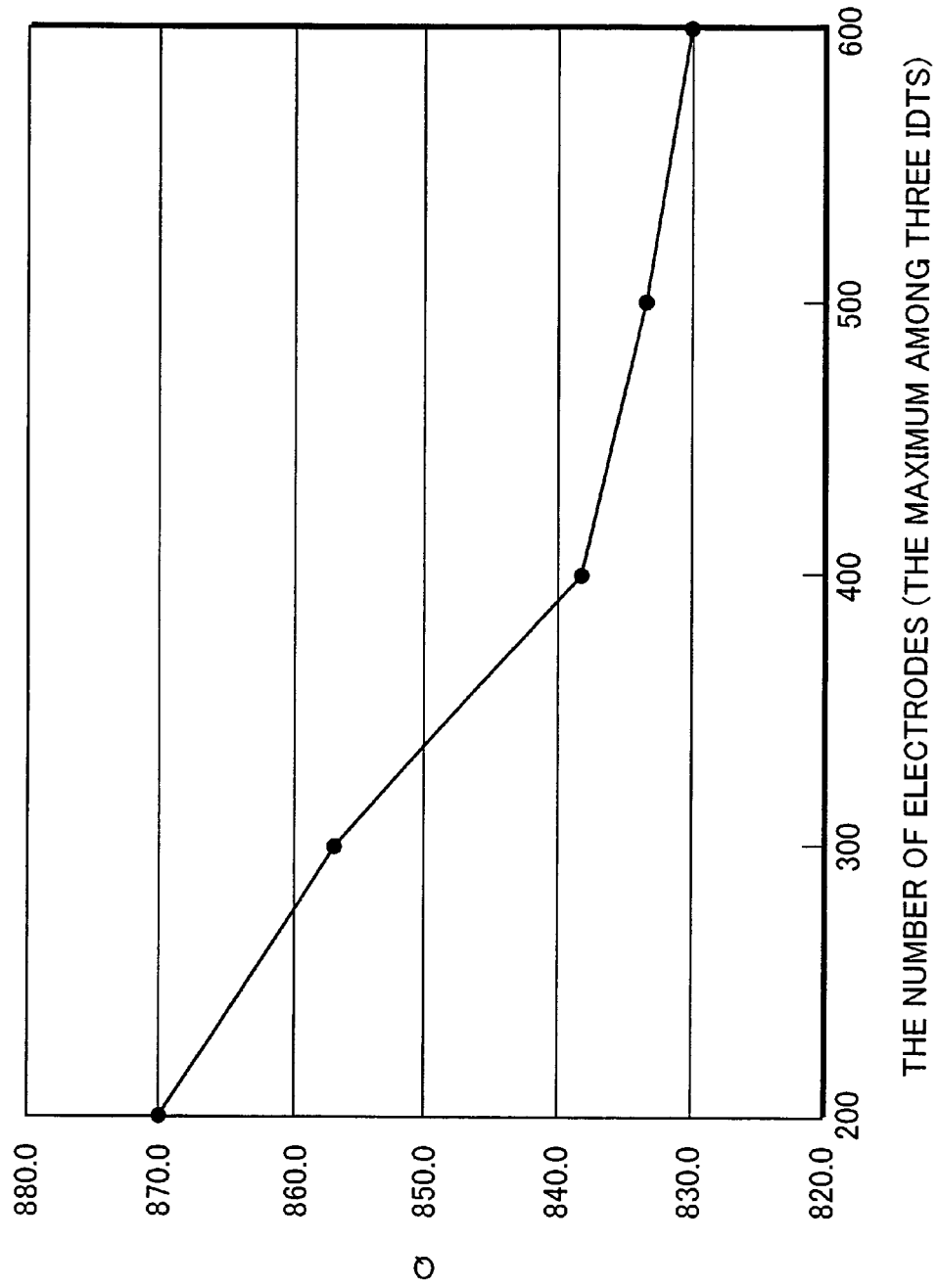
FIG. 5 is a graph showing Q-factor when a plurality of the surface acoustic wave resonators having the same resonance frequency but different structure are connected in parallel, which is obtained by simulation.

FIG. 5 is a graph representing the Q-factor of a resonance when a plurality of the surface acoustic wave resonators 14 having the same resonance frequency but structures different from one another are connected in parallel, which is obtained by simulation. FIG. 5 shows the Q-factor of resonance of the surface acoustic wave resonator 10 when the IDTs 12 in the three surface acoustic wave resonators 14 of the surface acoustic wave resonator 10 have different numbers of the electrode fingers 15 and the resonance frequencies of the surface acoustic wave resonators 14 are the same. In this example, the pitch P1 is varied in order to compensate for a shift in the resonance frequency due to a difference in the numbers of the electrode fingers 15.

First, the surface acoustic wave resonator 10 shown in FIG. 1 is formed by connecting three surface acoustic wave resonators 14 which each have 200 electrode fingers 15 in parallel. This means that the combination of the numbers of electrode fingers 15 in the surface acoustic wave resonators 14 is 200, 200 and 200. In FIG. 5, the Q-factor 870 of such a resonator is shown on the vertical axis with the number of the electrode being 200.

The Q-factor 857 of the surface acoustic wave resonator 10 formed by connecting one surface acoustic wave resonator 14 having 300 electrode fingers 15 in the IDT 12 and the pitch P1 of 2.330 μm and two surface acoustic wave resonators 14 having 150 electrode fingers 15 and the pitch P1 of 2.329 μm in parallel is shown on the vertical axis with the number of the electrode being 300 in FIG. 5.

The Q-factor 838 of the surface acoustic wave resonator 10 formed by connecting one surface acoustic wave resonator 14 having 400 electrode fingers 15 in the IDT 12 and the pitch P1 of 2.330 μm, one surface acoustic wave resonator 14 having 150 electrode fingers 15 and the pitch P1 of 2.329 μm, and one surface acoustic wave resonator 14 having 50 electrode fingers 15 and the pitch P1 of 2.321 μm in parallel is shown on the vertical axis with the number of the electrode being 400 in FIG. 5.

The Q-factor 833.5 of the surface acoustic wave resonator 10 formed by connecting one surface acoustic wave resonator 14 having 500 electrode fingers 15 in the IDT 12 and the pitch P1 of 2.330 µm and two surface acoustic wave resonators 14 having 50 electrode fingers 15 and the pitch P1 of 2.321 µm in parallel is shown on the vertical axis with the number of the electrode being 500 in FIG. 5.

The Q-factor 830 of the surface acoustic wave resonator of the conventional example which includes one IDT and 600 electrode fingers thereof, as in the series resonator 2 shown in FIG. 13, for example, is shown on the vertical axis with the number of the electrode fingers being 600 in FIG. 5. As shown in FIG. 5, the effect of improving the Q-factor is the highest when a plurality of like surface acoustic wave resonators 14 are connected in parallel (when the number of electrode fingers is 200). The Q-factor of resonance can be more improved compared to that of the surface acoustic wave resonator (the series resonator 2) according to the conventional example shown in FIG. 13 (when the number of electrode fingers is 600) even when a plurality of the surface acoustic wave resonators 14 having the same resonance frequency but different numbers of the electrode fingers 15 are connected in parallel to form the surface acoustic wave resonator 10 (when the number of electrode fingers is 300, 400 or 500).

It is known that in a one-port resonator as the surface acoustic wave resonator 14, ripple tends to be generated at a frequency of a signal corresponding to the number of the electrode fingers 15. When a plurality of surface acoustic wave resonators 14 respectively having the equal number of electrode fingers 15 as in the surface acoustic wave resonator 10 shown in FIG. 1 are connected in parallel, the frequency at which ripple is generated in each of the surface acoustic wave resonators 14 is the same. Thus, these ripples overlapped and the peak value of the ripple may increase.

Therefore, by connecting a plurality of the surface acoustic wave resonators 14 having the same resonance frequency but the numbers of the electrode fingers 15 in the IDT 12 different from one another in parallel to form the surface acoustic wave resonator 10, the frequency of the ripple generated at each of the surface acoustic wave resonators 14 can be varied and the ripples less overlapped. In this way, the peak value of the ripple can be reduced while the Q-factor of the resonance is improved.

In this example, three surface acoustic wave resonators 14 are connected in parallel to form the surface acoustic wave resonator 10. However, the number of the surface acoustic wave resonators 14 connected in parallel is not limited to three, but it may be two, four or higher.

Conventionally, it is known that when the IDT and the reflectors are formed with the same electrode pitch, a peak frequency of a radiation conductance of the IDT is lower than a central frequency of a reflection property of the reflectors. Thus, usually, the pitch in the reflectors is made slightly larger than the pitch in the IDT to have the peak frequency of the radiation conductance of the IDT and the central frequency of the reflection property of the reflectors which approximately match one another to improve the Q-factor of resonance. However, when a piezoelectric material having a high reflectivity of the electrode fingers is used and the number of the electrode fingers of the IDT increases, the IDT itself functions as a reflector. This is substantially the same as providing a reflector having the same pitch as the IDT. The Q-factor of resonance is deteriorated.

Therefore, in the present invention, the IDT is divided and the number of the each of the IDTs is decreased to improve the Q-factor of the resonance. Also, the IDTs are connected in parallel and a desired property is achieved.

Figure 6:
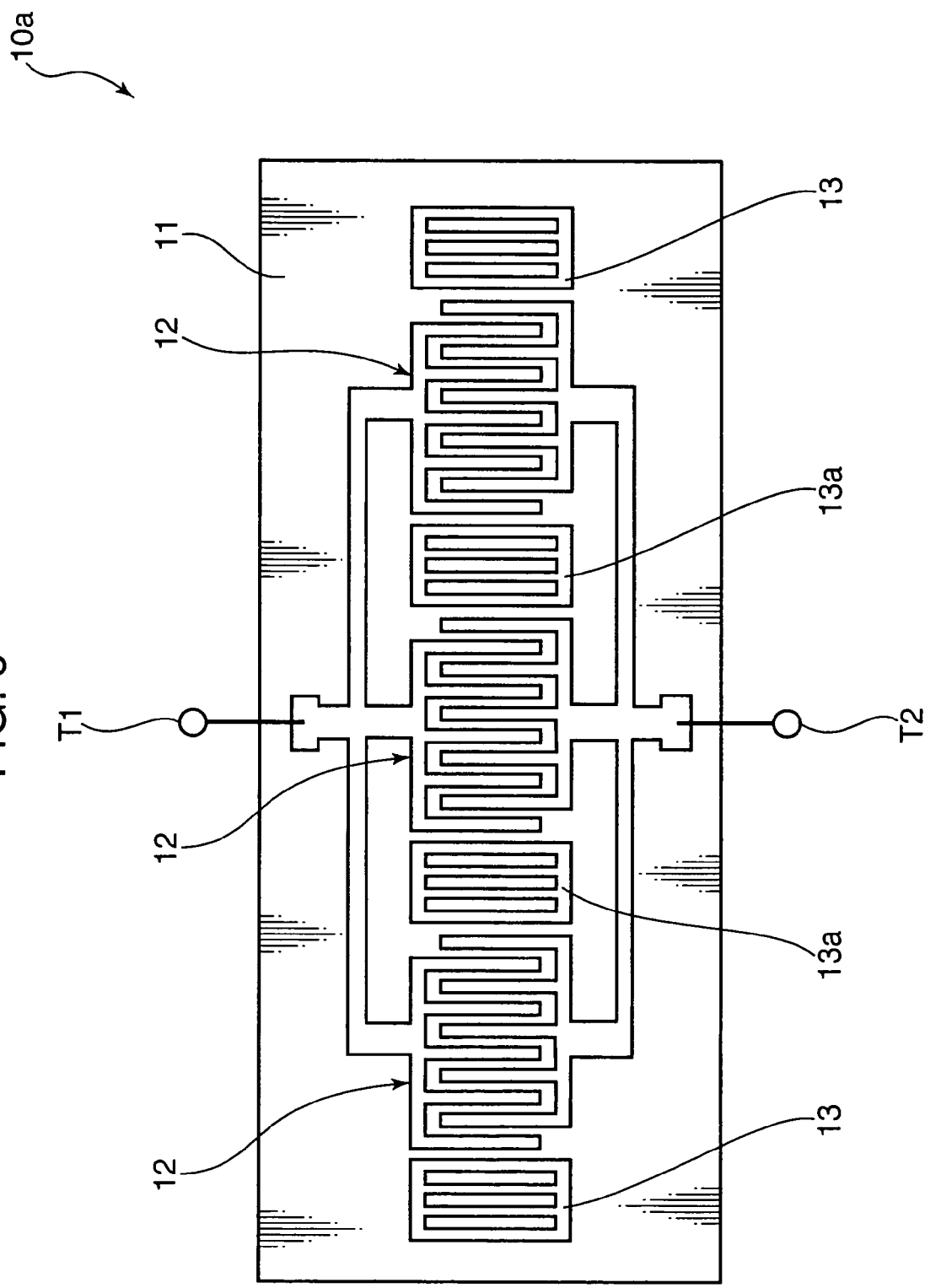
FIG. 6 is a graph showing a structure of electrodes of surface acoustic wave resonators of another form.

FIG. 6 shows an exemplary structure of a surface acoustic wave resonator 10a which is another form of Embodiment 1 of the present invention. The surface acoustic wave resonator 10a shown in FIG. 6 includes a signal input terminal T1 for receiving a signal input from the outside, a signal output terminal T2 for outputting a signal to the outside, and a piezoelectric substrate 11 formed of 39° Y-cut, X-propagating lithium tantalate. On a surface of the piezoelectric substrate 11, a plurality of, for example, three IDTs 12 are provided in a line on the same surface acoustic wave propagation path. Reflectors 13a are respectively provided between the IDTs 12. Two reflectors 13 are respectively provided near both ends of the line of the IDTs 12. The plurality of the IDTs 12 are connected in parallel to each other, and are respectively connected between the signal input terminal T1 and the signal output terminal T2. In this example, the reflectors 13a provided between the IDTs 12 in the surface acoustic wave resonator 10a are also used by the IDTs 12 on the both sides.

A film thickness of electrodes of the IDT 12 and the reflectors 13 and 13a is about 0.4 µm, an overlap length W of the IDT 12 is about 40 µm, the number of electrode fingers 15 in the IDTs 12 is 200, the number of electrodes in the reflectors 13a provided between the three IDTs 12 is 50, the number of electrodes in the reflectors 13 at the both ends is 50, pitch P1 for the electrode fingers in the IDTs 12 is about 2.33 µm, and pitch P2 for the electrodes in the reflectors 13 and 13a is about 2.38 µm.

The Q-factor of the resonance of the surface acoustic wave resonator 10a obtained as such is measured to be about 870. This figure is similar to the Q-factor of the surface acoustic wave resonator 10 having the separate surface acoustic wave resonators 14 connected in parallel as shown in FIG. 1. The two reflectors 13 provided between the IDTs 12 in the surface acoustic wave resonator 10 can be replaced with one reflector 13a in the surface acoustic wave resonator 10a. Thus, the size of the surface acoustic wave resonator 10a can be small.

The higher the electrode number in the reflectors 13a between the IDTs 12 is, the more desirable. Since the size increases as the number increases, the number is may not be larger than the number of the electrodes in the reflectors 13 at both ends.

Figure 7:
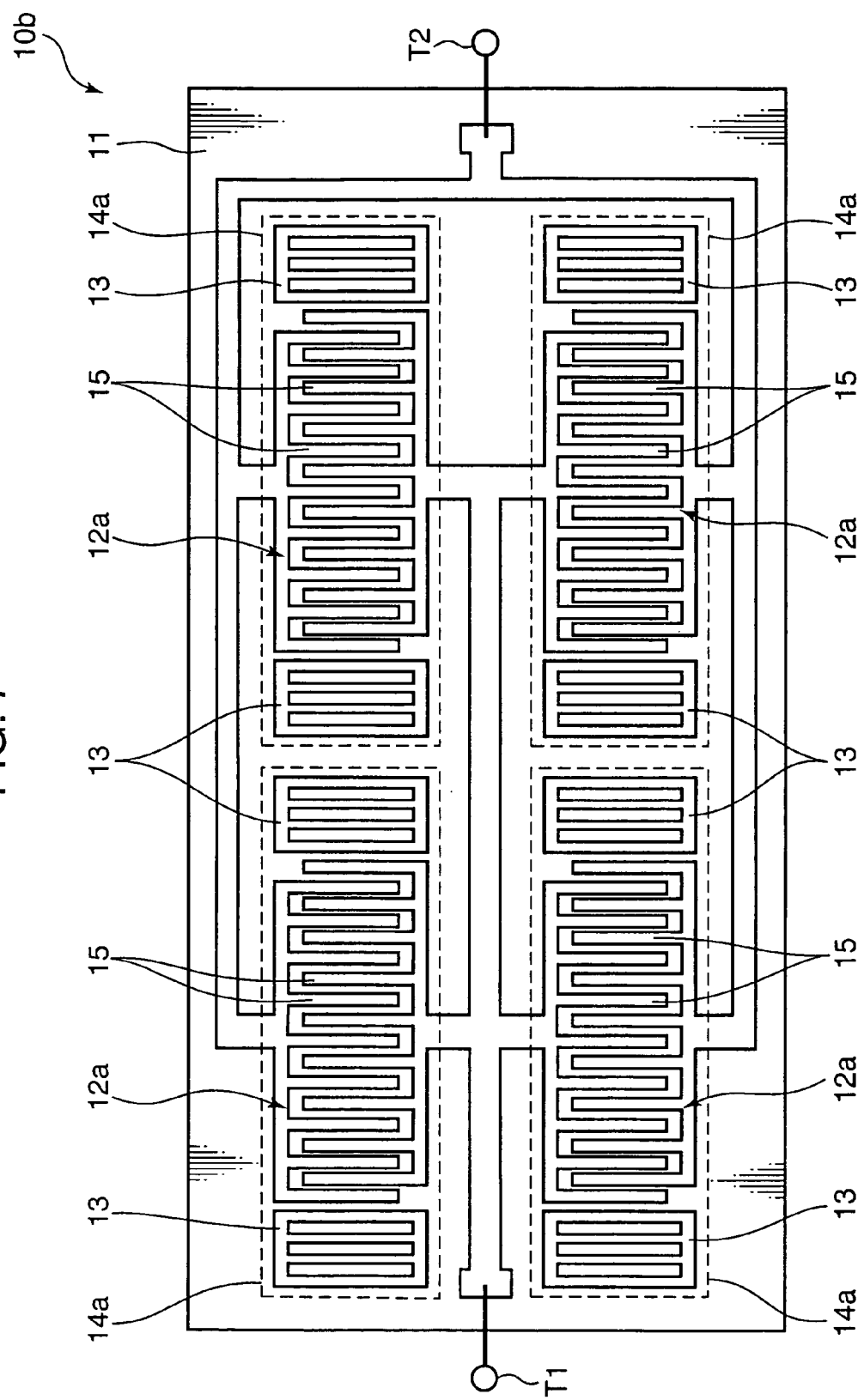
FIG. 7 is a graph showing a structure of electrodes of surface acoustic wave resonators of another form.

FIG. 7 shows an exemplary structure of a surface acoustic wave resonator 10b which is another form of Embodiment 1 of the present invention. The surface acoustic wave resonator 10b shown in FIG. 7 is a so-called one-port resonator, and includes a signal input terminal T1 for receiving a signal input from the outside, a signal output terminal T2 for outputting a signal to the outside, and a piezoelectric substrate 11 formed of 39° Y-cut, X-propagating lithium tantalate. On a surface of the piezoelectric substrate 11, four surface acoustic wave resonators 14a are formed.

Each of the surface acoustic wave resonators 14a includes an IDT 12a and reflectors 13 provided near both ends of the IDT 12a. Four like surface acoustic wave resonators 14a, i.e., the surface acoustic wave resonators 14a having the same resonance frequency, are connected in parallel, and are respectively connected between the signal input terminal T1 and the signal output terminal T2. Two surface acoustic wave resonators 14a are provided in line to form a pair. Two pairs are provided side by side instead of being aligned.

A film thickness of electrodes in the surface acoustic wave resonators 14a is about 0.4 µm, an overlap length W of the IDTs 12a is about 40 µm, the number of electrode fingers 15 in the IDTs 12a is 150, the number of electrodes in the reflectors 13 is 50, and pitch P2 for the electrodes in the reflectors 13 is about 2.38 µm. Pitch P1 (interval) of the electrode fingers 15 in the IDTs 12a is about 2.28 µm at the both ends. Pitch P1 between the electrode fingers 15 from the fifteenth electrode fingers 15 from both ends of the IDT 12a is 2.33 µm. This means that, the pitch P1 between the electrode fingers 15 near the center of the IDT 12a is 2.33 µm. The pitch P1 for the electrode finger 15 from both ends of the IDT 12a to the fifteenth electrode fingers 15 gradually increases from 2.28 µm to 2.33 µm.

Usually, as the number of electrode fingers 15 in the IDTs 12a is decreased in a one-port resonator such as the surface acoustic wave resonator 10b shown in FIG. 7, ripple tends to be generated near the resonance point. Thus, in the surface acoustic wave resonator 10b shown in FIG. 7, the pitch P1 for a part of the electrode fingers 15 near both ends of the IDTs 12a and the pitch P1 for the electrode fingers 15 near the center are varied. In this way, the Q-factor of resonance can be improved while the ripple is reduced.

Figure 8A:
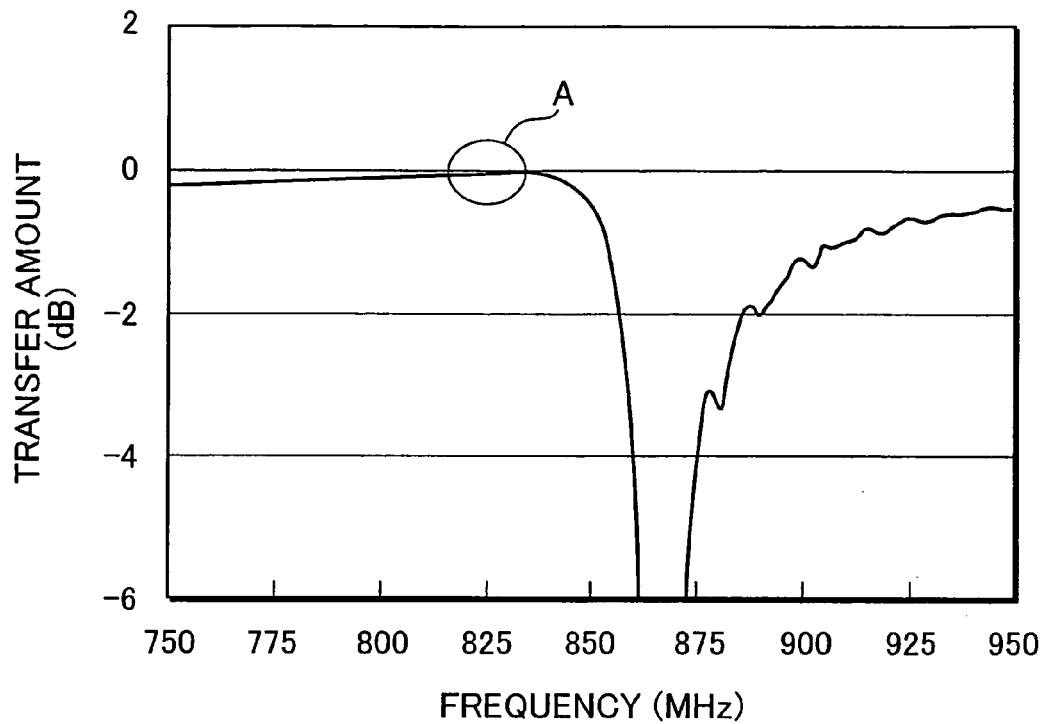
FIGS. 8A and 8B are graphs for illustrating an effect of reducing ripple caused by the surface acoustic wave resonators shown in FIG. 7.
Figure 8B:
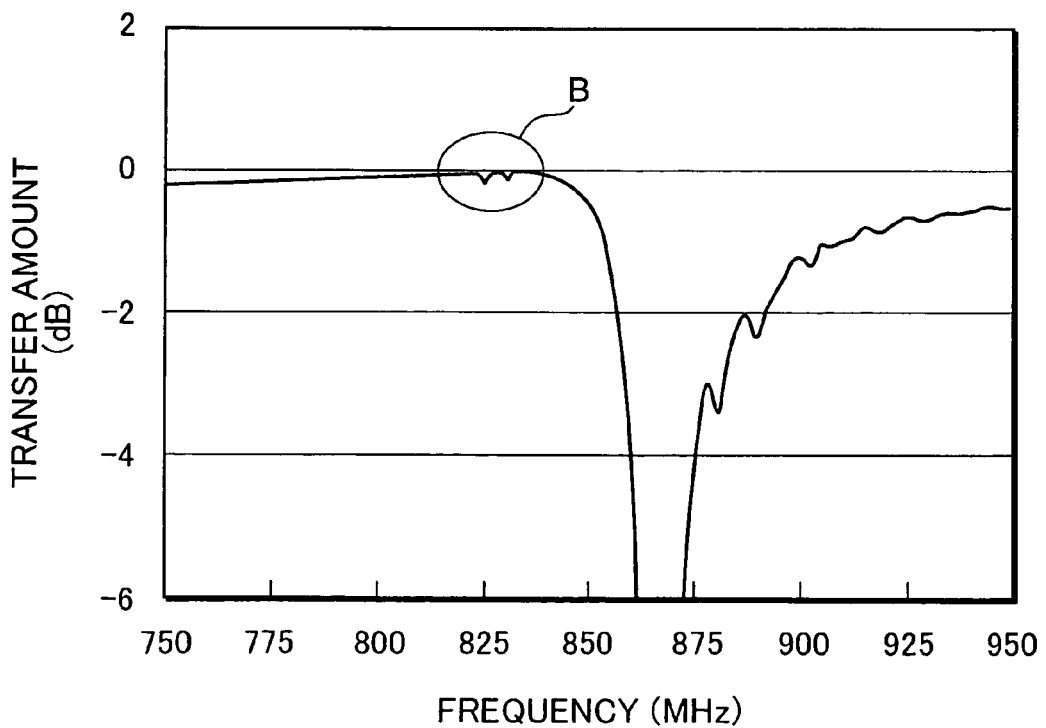

FIGS. 8A and 8B are graphs for illustrating an effect of reducing ripple achieved by the surface acoustic wave resonator 10b. FIG. 8A is a graph showing a result of simulation for obtaining a frequency property of the surface acoustic wave resonator 10b shown in FIG. 7. FIG. 8B is a graph showing a result of simulation for obtaining a frequency property when the pitch P1 for any of the electrode fingers 15 in the IDTs 12a of the surface acoustic wave resonator 10b shown in FIG. 7 is 2.33 µm. In FIGS. 8A and 8B, horizontal axes show the frequency of the signal input to the signal input terminal T1, and the vertical axes show an amount of transfer when the signal received by the signal input terminal T1 is output from the signal output terminal T2 which is represented in decibel.

As shown in FIG. 8B, when the pitch P1 for the electrode fingers 15 in the IDTs 12a is set to be the uniform value, 2.33 µm, ripple is generated around 825 MHz as denoted by reference numeral B. On the other hand, when the surface acoustic wave resonator 10b shown in FIG. 7 is used, ripple is not generated even around 825 MHz as denoted by reference numeral A. The effect of reducing the ripple achieved by the surface acoustic wave resonator 10b shown in FIG. 7 is confirmed.

In the surface acoustic wave resonator 10b shown in FIG. 7, it is preferable to start varying the pitch P1 in the IDTs 12a, which is different from the pitch P1 at the center of the IDTs 12a, at the fifteenth electrode fingers 15 from both ends. It is not limited to the fifteenth electrode fingers from the ends. As long as the pitch P1 for a part of the electrode fingers 15 among the plurality of electrode fingers 15 of the IDTs 12a at the both ends is different from the pitch P1 at the center of the IDTs 12a, such a structure may be employed.

In this example, the difference between the pitch P1 for the electrode fingers 15 near the center of the IDTs 12a and the pitch P1 for the electrode fingers 15 at both ends of the IDTs 12a is 0.05 µm. The difference in the pitch P1 between the portion near the center and both ends may be about 0.5% to 3% of the pitch P1 near the center, for example.

In this example, the pitch P1 for the electrode fingers 15 from the both ends of the IDTs 12a to the fifteenth electrode fingers 15 gradually increases toward the center. The present invention is not limited to such a gradual increase. As long as the pitch at both ends is different from the pitch P1 near the center, the pitches P1 of the electrode fingers 15 at both ends of the IDTs 12a may be substantially uniform.

Figure 9:
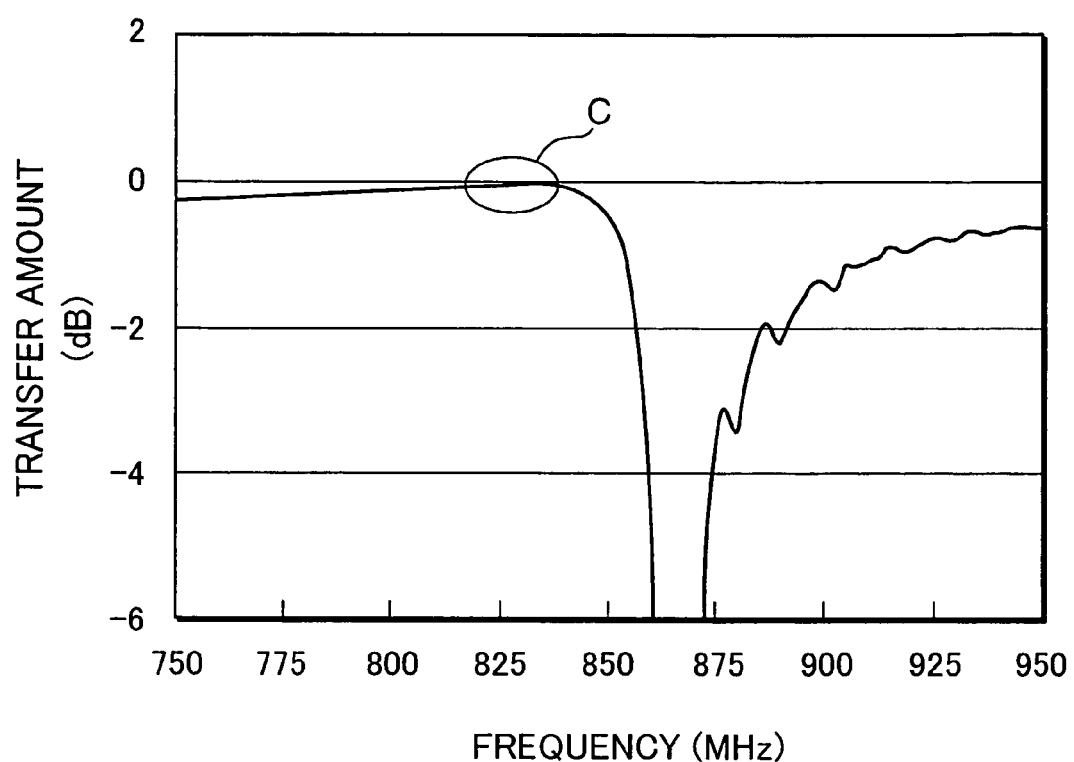
FIG. 9 is a graph showing a result of simulation for obtaining a frequency property when pitch for the electrode fingers from both ends of the IDTs of the surface acoustic wave resonator shown in FIG. 7 to the fifteenth electrode fingers is 2.31 µm, and the pitch for the rest of the electrode fingers 15 is 2.33 µm.

FIG. 9 is a graph showing a result of a simulation for obtaining a property when the pitch P1 for the electrode fingers 15 from both ends of the IDTs 12a of the surface acoustic wave resonator 10b shown in FIG. 7 to the fifteenth electrode fingers 15 is 2.31 µm, and the pitch P1 for the rest of the electrode fingers 15 is 2.33 µm. As shown in FIG. 9, even when the pitches P1 for the electrode fingers 15 at the both ends of the IDTs 12a are uniform instead of gradually increasing, ripple is not generated near 825 MHz as denoted by reference numeral C. The effect of reducing ripple is confirmed.

Embodiment 2

Hereinafter, Embodiment 2 of the present invention will be described. In Embodiment 1 of the present invention, a structure of a surface acoustic wave resonator is shown. Embodiment 2 is different from Embodiment 1 in that a structure of a ladder-type surface acoustic wave filter using such a surface acoustic wave resonator is shown.

Figure 10:
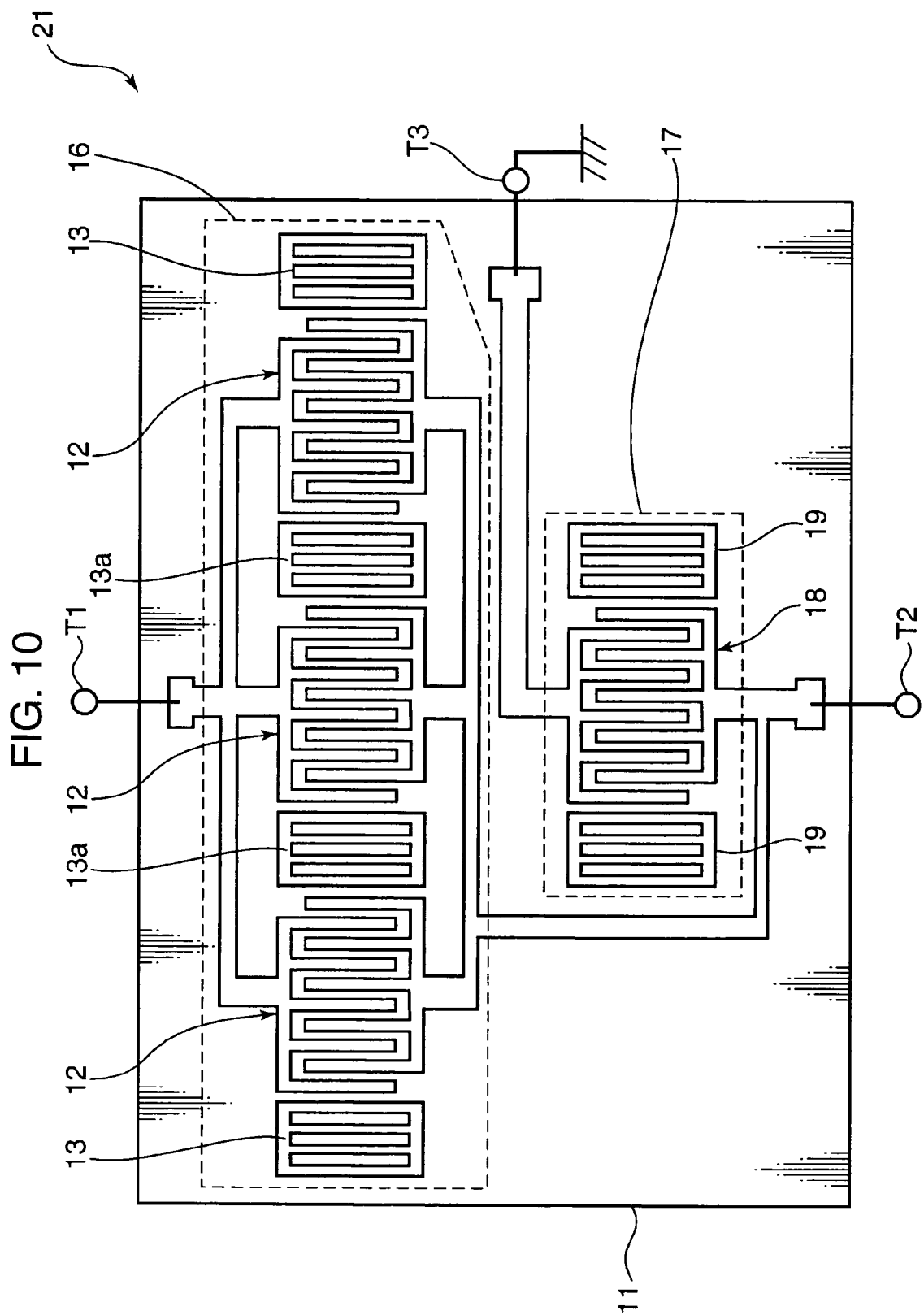
FIG. 10 is a diagram showing a structure of electrodes of a surface acoustic wave filter (Embodiment 2).

FIG. 10 is a diagram showing an exemplary structure of a surface acoustic wave filter 21 according to Embodiment 2 of the present invention. The surface acoustic wave filter 21 shown in FIG. 10 is an example of a ladder-type surface acoustic wave filter, and includes a signal input terminal T1 for receiving a signal input from the outside, a signal output terminal T2 for outputting a signal to the outside, a ground terminal T3 for ground connection, and a piezoelectric substrate 11 formed of 39° Y-cut, X-propagating lithium tantalate. On a surface of the piezoelectric substrate 11, a series resonator 16 and a parallel resonator 17 are formed.

The signal input terminal T1, the signal output terminal T2, and the ground terminal T3 may be wiring patterns formed on the surface of the piezoelectric substrate 11, connectors for connecting the surface acoustic wave filter 21 to an external circuit, or the like.

The series resonator 16 is a surface acoustic wave resonator which is provided between the signal input terminal T1 and the signal output terminal T2, i.e., is serially connected to a signal path from the signal input terminal T1 to the signal output terminal T2. For example, a surface acoustic wave resonator 10a shown in FIG. 6 is employed. The series resonator 16 may also be a surface acoustic wave resonator 10 shown in FIG. 1, or a surface acoustic wave resonator 10b shown in FIG. 7. The parallel resonator 17 is a surface acoustic wave resonator which is provided between the signal output terminal T2 and the ground terminal T3, i.e., which is connected between the signal path and ground.

The series resonator 16 is formed similarly to the surface acoustic wave resonator 10a shown in FIG. 6. A plurality of, for example, three IDTs 12 are provided in a line on the same surface acoustic wave propagation path of the surface of the piezoelectric substrate 11. A reflector 13a is respectively provided between the IDTs 12. Reflectors 13 are provided near both ends of the line of the IDTs 12. The plurality of the IDTs 12 are connected in parallel between the signal input terminal T1 and the signal output terminal T2.

A film thickness of electrodes in the series resonator 16 and the parallel resonator 17 is about 0.4 µm. In the series resonator 16, an overlap length W of the IDT 12 is about 40 µm, the number of electrode fingers 15 in the IDTs 12 is 200, the number of electrodes in the reflectors 13a provided between the IDTs 12 is 20, the number of electrodes in the reflectors 13 at the both ends of the series resonator 16 is 50, pitch P1 for the electrode fingers in the IDTs 12 is about 2.33 µm, and pitch P2 for the electrodes in the reflectors 13 and 13a is about 2.38 µm.

The parallel resonator 17 is formed by connecting one IDT 18 between the signal output terminal T2 and the ground terminal T3 on the piezoelectric substrate 11, and providing reflectors 19 near both ends of the IDT 18. An overlap length W at electrode fingers of the IDT 18 is about 40 µm, the number of electrode fingers in the IDT 18 is 200, pitch P1 for the electrode fingers in the IDT 18 is about 2.44 µm, and pitch P2 for the electrodes in the reflectors 19 is about 2.42 µm.

Figure 11:
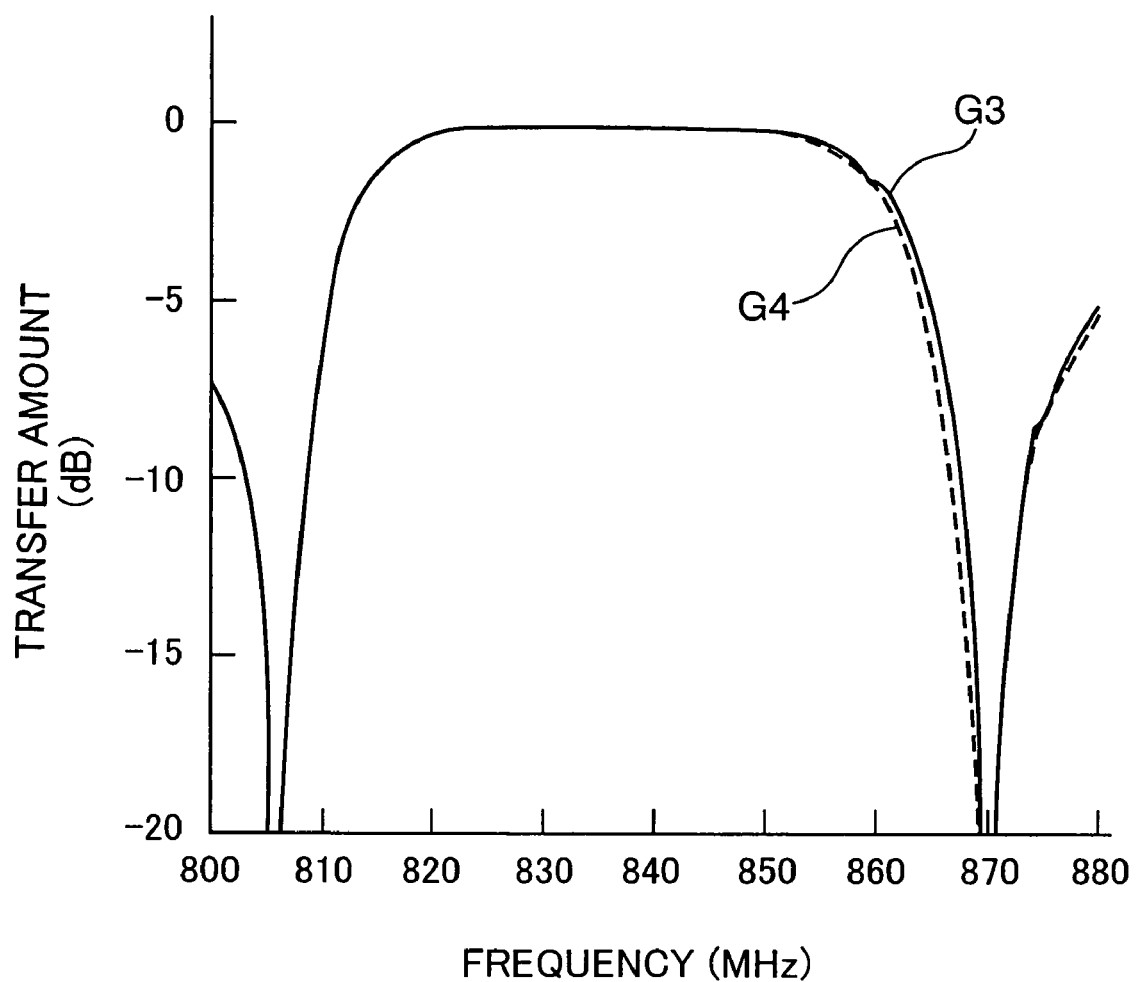
FIG. 11 is a diagram showing a comparison of frequency properties of the surface acoustic wave filter shown in FIG. 10 and a conventional surface acoustic wave filter.

FIG. 11 is a graph showing a comparison between a frequency property of the surface acoustic wave filter 21 having the above-described structure, and a frequency property of the conventional surface acoustic wave filter shown in FIG. 13. In FIG. 11, the frequency property of the surface acoustic wave filter 21 shown in FIG. 10 is represented by a solid line as graph G3, and the frequency property of the conventional surface acoustic wave filter shown in FIG. 13 is represented by a broken line as graph G4.

As can be seen from FIG. 11, it is confirmed that the frequency property of the surface acoustic wave filter 21 represented by the graph G3 has a broadened band and improved steepness in a band higher than a pass band (around 865 MHz) compared to the frequency property of the conventional surface acoustic wave filter represented by the graph G4.

In the surface acoustic wave filter 21 shown in FIG. 10, only the series resonator 16 is formed by connecting a plurality of the IDTs 12 in parallel. The parallel resonator 17 can also be formed by connecting a plurality of IDTs 18, and for example, the surface acoustic wave resonator 10, 10a, or 10b may be employed.

Embodiment 3

Hereinafter, Embodiment 3 of the present invention will be described. Embodiment 3 is different from Embodiment 2 in that, while Embodiment 2 relates to a ladder-type surface acoustic wave filter using one terminal pair surface acoustic wave resonator, Embodiment 3 is applied to a surface acoustic wave filter using a multiple-port surface acoustic wave resonator.

Figure 12:
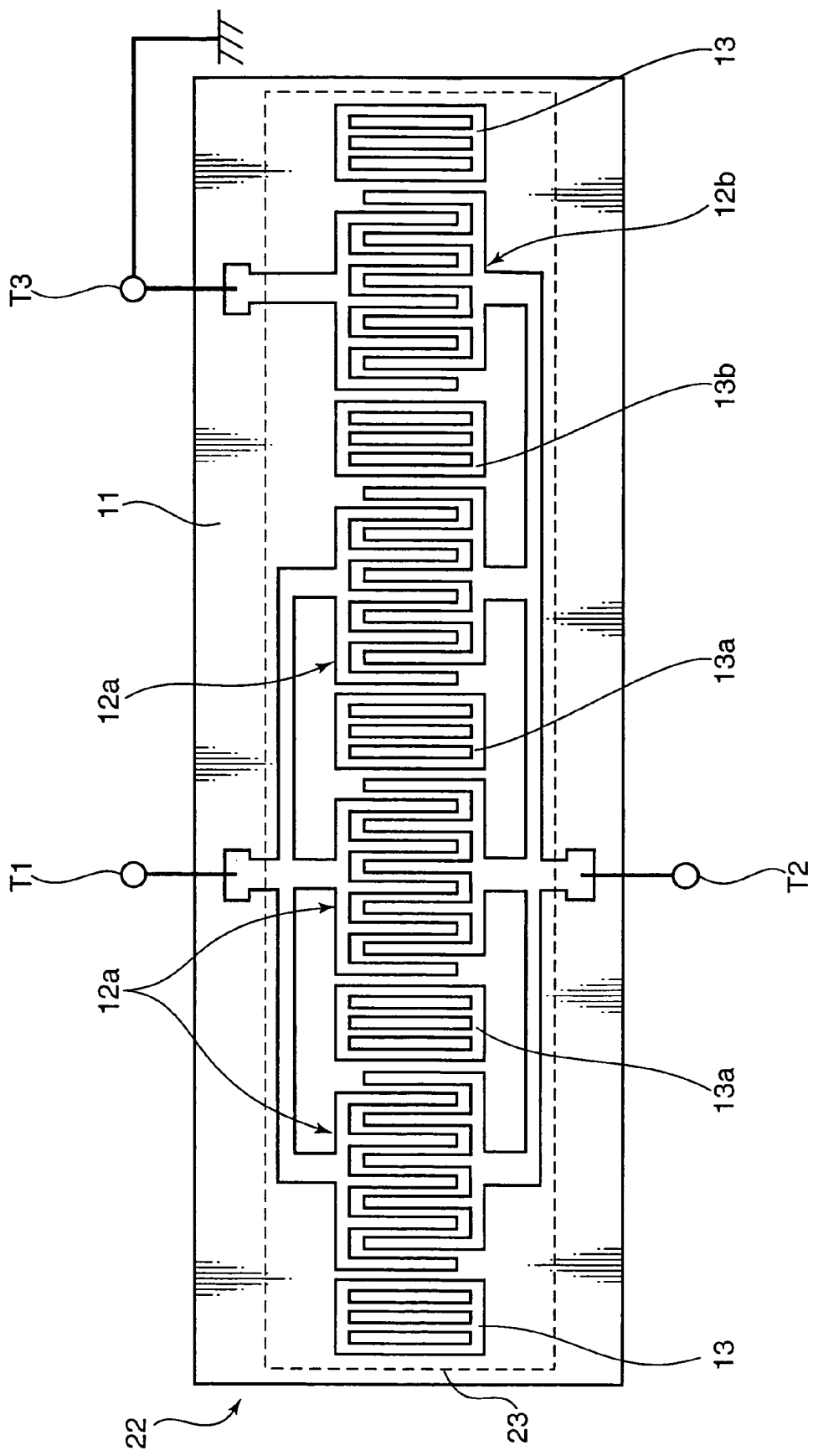
FIG. 12 is a diagram showing a structure of electrodes of the surface acoustic wave filter (Embodiment 3).

FIG. 12 shows an exemplary structure of a surface acoustic wave filter 22 according to Embodiment 3 of the present invention. The surface acoustic wave filter 22 shown in FIG. 12 is an example of a ladder-type surface acoustic wave filter, and includes a signal input terminal T1 for receiving a signal input from the outside, a signal output terminal T2 for outputting a signal to the outside, a ground terminal T3 for a ground connection, and a piezoelectric substrate 11 formed of 39° Y-cut, X-propagating lithium tantalate. On a surface of the piezoelectric substrate 11, a multiple-port surface acoustic wave resonator 23 is formed.

In the multiple-port surface acoustic wave resonator 23, IDTs 12a and 12b and reflectors 13, 13a, and 13b are provided in line on the same surface acoustic wave propagation path on the piezoelectric substrate 11. In the multiple-port surface acoustic wave resonator 23, a plurality of, for example, three IDTs 12a are provided. A reflector 13a is respectively provided between the IDTs 12a. A reflector 13 is provided near one end of the line of the IDTs 12a, and the reflector 13b is provided near the other end. The plurality of the IDTs 12a are connected in parallel to each other and are serially connected to the signal path between the signal input terminal T1 and the signal output terminal T2.

The IDT 12b is provided such that one end of the IDT 12b is located near the reflector 13b. A reflector 13 is provided near the other end of the IDT 12b. The IDT 12b is connected between the signal output terminal T2 and the ground terminal T3, i.e., between the signal path and the ground.

The multiple-port surface acoustic wave resonator 23 having the above-described structure is a single surface acoustic wave resonator formed by aligning the IDTs 12a and 12b and reflectors 13, 13a, and 13b on the same surface acoustic wave propagation path on the piezoelectric substrate 11, and also forms a multiple-port surface acoustic wave filter 22 including a signal input terminal T1, a signal output terminal T2, and a ground terminal T3.

In such a case, three IDTs 12a, a reflector 13a near the IDT 12a, two reflectors 13a, and a reflector 13 form a series resonator. The reflector 13b, the IDT 12b, and a reflector 13 near the IDT 12b forms a parallel resonator. The reflector 13b at one end of the series resonator is also used as the reflector 13b at one and of the parallel resonator.

A film thickness of electrodes in the multiple-port surface acoustic wave filter 22 is about 0.4 μm. An overlap length W of the IDTs 12a and 12b is about 40 μm, the number of electrode fingers in the IDTs 12a is 200, the number of electrode fingers in the IDT 12b is 200, the number of electrodes in the reflectors 13a is 20, the number of electrodes in the reflector 13b is 20, the number of electrodes in the reflectors 13 is 50, pitch P1 for the electrode fingers in the IDTs 12a is about 2.33 μm, pitch P1 for the electrode fingers in the IDT 12b is about 2.44 μm, pitch P2 in the reflectors 13a is about 2.38 μm, pitch P2 in the reflector 13b is about 2.41 μm, pitch P2 in the reflector 13 near the IDT 12a is about 2.38 μm, and pitch P2 in the reflector 13 near the IDT 12b is about 2.42 μm.

In this way, the number of the reflectors can be decreased by one compared to that of the surface acoustic wave filter 21 shown in FIG. 10. Thus, the multiple-port surface acoustic wave filter 22 can be made smaller than the surface acoustic wave filter 21. Similarly to the surface acoustic wave filter 21 shown in FIG. 10, the pass band for a signal is broadened and the steepness can be improved than in the conventional surface acoustic wave filter shown in FIG. 13.

It is preferable that the IDTs 12a have the same structure such as the sane number of electrode fingers and the pitch for the electrode fingers. The number of the electrode fingers in the IDT 12b may be selected as appropriate depending upon the design.

The IDT 12b connected between the signal path and the ground may be replaced with a plurality of the IDTs connected in parallel with reflectors being inserted between the IDTs.

The reflectors 13a between the IDTs 12a are necessary for achieving the effect of the present invention. The reflector 13b between the IDT 12a and the IDT 12b may be omitted depending upon the design.

INDUSTRIAL APPLICABILITY

The surface acoustic wave resonator and the surface acoustic wave filter according to the present invention provide an effect of improving a Q-factor of a resonance and providing a surface acoustic wave filter with a low insertion loss and high steepness. The present invention is useful for filters in the field of communication such as cellular phones and the like, or the field of video images such as televisions and the like.

The invention claimed is:

1. A surface acoustic wave resonator, comprising:
a piezoelectric substrate having a surface;
a plurality of interdigital transducers provided on the surface of the piezoelectric substrate, each interdigital transducer of the plurality of interdigital transducers including a plurality of electrode fingers; and
a plurality of reflecting electrodes provided on the surface of the piezoelectric substrate, at least one reflecting electrode of the plurality of reflecting electrodes being disposed at each of two sides of each interdigital transducer of the plurality of interdigital transducers,
wherein the plurality of interdigital transducers are connected in parallel, wherein resonance frequencies of a plurality of surface acoustic wave resonators formed by the plurality of interdigital transducers and the plurality of reflecting electrodes are substantially the same, and wherein a number of electrode fingers included in a first interdigital transducer of the plurality of interdigital transducers is different from a number of electrode fingers included in a second interdigital transducer of the plurality of interdigital transducers so as to reduce a peak value of a ripple generated by the first interdigital transducer and the second interdigital transducer.

2. A surface acoustic wave resonator according to claim 1, wherein at least two interdigital transducers of the plurality of interdigital transducers share a reflecting electrode as the at least one reflecting electrode disposed at proximate sides of the at least two interdigital transducers.

3. A surface acoustic wave resonator according to claim 1, wherein the plurality of the interdigital transducers are provided along a same surface acoustic wave propagation path.

4. A surface acoustic wave resonator according to claim 1, wherein an interval between electrode fingers in a central portion of each interdigital transducer of the plurality of interdigital transducers is different in magnitude than an interval between electrode fingers at end portions of each interdigital transducer of the plurality of interdigital transducers.

5. A surface acoustic wave resonator according to claim 4, wherein intervals between electrode fingers at end portions of each interdigital transducer of the plurality of interdigital transducers are substantially the same.

6. A surface acoustic wave resonator according to claim 4, wherein intervals between electrode fingers at end portions of each interdigital transducer of the plurality of interdigital transducers gradually vary from outermost portions of the end portions toward innermost portions of the end portions so as to become closer in magnitude to intervals between the electrode fingers in a central portion of each interdigital transducer of the plurality of interdigital transducers.

7. A surface acoustic wave resonator according to claim 4, wherein end portions of each interdigital transducer of the plurality of interdigital transducers comprise electrode fingers ranging from an outermost electrode finger to a fifteenth electrode finger inward from the outermost electrode finger.

8. A surface acoustic wave filter, comprising:
a signal input terminal for receiving an input signal from outside;
a signal output terminal for outputting a signal to the outside,
a ground terminal for ground connection;
a piezoelectric substrate having a surface;
a series resonator provided on the surface of the piezoelectric substrate between the signal input terminal and the signal output terminal; and
a parallel resonator provided between the signal output terminal and the ground terminal on the surface of the piezoelectric substrate,
wherein the series resonator is the surface acoustic wave resonator according to claim 1.

9. A surface acoustic wave filter according to claim 8, wherein the plurality of interdigital transducers of the series resonator comprise a first plurality of interdigital transducers, wherein the plurality of reflecting electrodes of the series resonator comprise a first plurality of reflecting electrodes, wherein the plurality of surface acoustic wave resonators formed by the first plurality of interdigital transducers and the first plurality of reflecting electrodes comprise a first plurality of surface acoustic wave resonators, wherein the parallel resonator is a surface acoustic wave resonator, and wherein the parallel resonator comprises:
a second plurality of interdigital transducers provided on the surface of the piezoelectric substrate, each interdigital transducer of the second plurality of interdigital transducers including a plurality of electrode fingers; and
a second plurality of reflecting electrodes provided on the surface of the piezoelectric substrate, at least one reflecting electrode of the second plurality of reflecting electrodes being disposed at each of two sides of each interdigital transducer of the second plurality of interdigital transducers, wherein the second plurality of interdigital transducers are connected in parallel, and wherein resonance frequencies of a second plurality of surface acoustic wave resonators formed by the second plurality of interdigital transducers and the second plurality of reflecting electrodes are substantially the same.

10. A surface acoustic wave filter comprising:
a signal input terminal for receiving an input signal from outside;
a signal output terminal for outputting a signal to the outside,
a ground terminal for ground connection;
a piezoelectric substrate having a surface;
a series resonator provided on the surface of the piezoelectric substrate between the signal input terminal and the signal output terminal; and
a parallel resonator provided between the signal output terminal and the ground terminal on the surface of the piezoelectric substrate, wherein the series resonator and the parallel resonator are provided on the same surface acoustic wave propagation path, wherein a reflecting electrode on one end of the series resonator is also used as a reflecting electrode on one end of the parallel resonator, and wherein the series resonator is a surface acoustic wave resonator comprising:
a plurality of interdigital transducers provided on the surface of the piezoelectric substrate, each interdigital transducer of the plurality of interdigital transducers including a plurality of electrode fingers; and
a plurality of reflecting electrodes provided on the surface of the piezoelectric substrate, at least one reflecting electrode of the plurality of reflecting electrodes being disposed at each of two sides of each interdigital transducer of the plurality of interdigital transducers, wherein the plurality of interdigital transducers are connected in parallel, and wherein resonance frequencies of a plurality of surface acoustic wave resonators formed by the plurality of interdigital transducers and the plurality of reflecting electrodes are substantially the same.

11. The surface acoustic wave filter according to claim 10,
wherein the plurality of interdigital transducers of the series resonator comprise a first plurality of interdigital transducers,
wherein the plurality of reflecting electrodes of the series resonator comprise a first plurality of reflecting electrodes,
wherein the plurality of surface acoustic wave resonators formed by the first plurality of interdigital transducers and the first plurality of reflecting electrodes comprise a first plurality of surface acoustic wave resonators,
wherein the parallel resonator is a surface acoustic wave resonator, and
wherein the parallel resonator comprises:
a second plurality of interdigital transducers provided on the surface of the piezoelectric substrate, each interdigital transducer of the second plurality of interdigital transducers including a plurality of electrode fingers; and
a second plurality of reflecting electrodes provided on the surface of the piezoelectric substrate, at least one reflecting electrode of the second plurality of reflecting electrodes being disposed at each of two sides of each interdigital transducer of the second plurality of interdigital transducers,
wherein the second plurality of interdigital transducers are connected in parallel, and
wherein resonance frequencies of a second plurality of surface acoustic wave resonators formed by the second plurality of interdigital transducers and the second plurality of reflecting electrodes are substantially the same.

\* \* \* \* \*